(12) United States Patent
Park et al.

(10) Patent No.: US 9,253,873 B2
(45) Date of Patent: Feb. 2, 2016

(54) PRINTED CIRCUIT BOARD AND METHOD OF MANUFACTURING THE SAME

(71) Applicant: SAMSUNG ELECTRO-MECHANICS CO., LTD., Suwon (KR)

(72) Inventors: Seung Wook Park, Suwon (KR); Dong Hwan Lee, Suwon (KR); Jin Gu Kim, Suwon (KR); Chang Bae Lee, Suwon (KR); Christian Romero, Suwon (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 267 days.

(21) Appl. No.: 13/827,248

(22) Filed: Mar. 14, 2013

(65) Prior Publication Data

US 2014/0124258 A1     May 8, 2014

(30) Foreign Application Priority Data

Nov. 7, 2012   (KR) ................... 10-2012-0125386

(51) Int. Cl.
*H05K 1/02* (2006.01)
*H05K 3/46* (2006.01)

(52) U.S. Cl.
CPC ............ *H05K 1/0216* (2013.01); *H05K 3/4602* (2013.01); *H05K 3/4673* (2013.01);
(Continued)

(58) Field of Classification Search
CPC .................................. H05K 1/02; H05K 3/40
USPC .......... 174/388, 1–14 BH, 15.6–20, 30–31 S, 174/37–47, 480–507, 50–51, 53–64, 174/650–669, 66–68.3, 69–73.1, 174/70 S–101.5, 135–212;
361/679.01–679.45, 679.55–679.61, 361/724–747, 752–759, 796–837, 794
See application file for complete search history.

(56) References Cited

U.S. PATENT DOCUMENTS 6,023,103 A * 2/2000 Chang ................. H01L 23/3114
                                                                257/781
6,246,247 B1 * 6/2001 Eldridge .............. B23K 20/004
                                                                257/E21.503

(Continued)

FOREIGN PATENT DOCUMENTS

JP           7-249876        9/1995
JP           7-276557       10/1995

(Continued)

OTHER PUBLICATIONS

Korean Notice of Allowance issued Apr. 23, 2014 in corresponding Korean Patent Application No. 10-2012-0125386.

*Primary Examiner* — Courtney Smith
*Assistant Examiner* — Rashen E Morrison
(74) *Attorney, Agent, or Firm* — NSIP Law

(57) ABSTRACT

Disclosed herein are a printed circuit board and a method of manufacturing the same. The printed circuit board includes: a core layer having a first circuit wiring layer formed on one surface or both surfaces thereof; an insulating layer laminated, as at least one layer, on one surface or both surfaces of the core layer; and a second circuit wiring layer formed on one surface of the insulating layer, wherein a conductive core is included in upper and lower insulating layers contacting the second circuit wiring layer requiring an electromagnetic wave shielding, or the conductive core is included in the insulating layer or the core layer contacting the first circuit wiring layer requiring the electromagnetic wave shielding.

12 Claims, 3 Drawing Sheets

(52) U.S. Cl.
   CPC   *H05K2201/0281* (2013.01); *H05K 2201/0323* (2013.01); *H05K 2201/0723* (2013.01); *H05K 2201/09581* (2013.01); *Y10T 29/49165* (2015.01)

(56) References Cited

U.S. PATENT DOCUMENTS

| | | | | |
|---|---|---|---|---|
| 7,800,917 B2* | 9/2010 | Shimada | | H05K 3/387 174/258 |
| 2002/0053734 A1* | 5/2002 | Eldridge | | B23K 20/004 257/724 |
| 2006/0108147 A1* | 5/2006 | Abe | | G01R 1/07314 174/262 |
| 2006/0248712 A1* | 11/2006 | Jo | | H05K 1/0218 29/830 |
| 2007/0025091 A1* | 2/2007 | Shimada | | H05K 3/387 361/750 |
| 2007/0090303 A1* | 4/2007 | Kristiansson | | G01R 19/0061 250/492.3 |
| 2008/0078573 A1* | 4/2008 | Hu | | H05K 1/0219 174/262 |
| 2009/0151990 A1* | 6/2009 | Nishino | | H05K 3/4655 174/258 |
| 2009/0231673 A1* | 9/2009 | Oden | | G02B 26/0841 359/291 |
| 2009/0260868 A1* | 10/2009 | Oh | | H05K 3/4647 174/262 |
| 2009/0277680 A1* | 11/2009 | Lee | | B82Y 10/00 174/377 |
| 2009/0294161 A1* | 12/2009 | Yoshimura | | H05K 3/4608 174/258 |
| 2010/0018758 A1* | 1/2010 | Yoshimura | | H05K 3/4608 174/256 |
| 2010/0051323 A1* | 3/2010 | Yokouchi | | B82Y 10/00 174/250 |
| 2010/0115767 A1* | 5/2010 | Hsu | | H05K 1/162 29/832 |
| 2010/0321914 A1* | 12/2010 | Inagaki | | H01L 21/4857 361/783 |
| 2012/0055706 A1* | 3/2012 | Mok | | H01G 4/228 174/260 |
| 2012/0125667 A1* | 5/2012 | Jung | | H05K 3/4644 174/251 |
| 2014/0124258 A1* | 5/2014 | Park | | H05K 1/0216 174/388 |
| 2015/0083472 A1* | 3/2015 | Shiratori | | H05K 1/056 174/255 |

FOREIGN PATENT DOCUMENTS

| | | |
|---|---|---|
| JP | 2002-217553 | 8/2002 |
| JP | 2003-304043 | 10/2003 |
| KR | 2001-0006198 | 1/2001 |
| KR | 10-2012-0046493 | 5/2012 |

* cited by examiner

PRINTED CIRCUIT BOARD AND METHOD OF MANUFACTURING THE SAME

CROSS REFERENCE(S) TO RELATED APPLICATIONS

This application claims the benefit under 35 U.S.C. Section 119 of Korean Patent Application Serial No. 10-2012-0125386, entitled "Printed Circuit Board and Method of Manufacturing the Same" filed on Nov. 7, 2012, which is hereby incorporated by reference in its entirety into this application.

BACKGROUND OF THE INVENTION

1. Technical Field

The present invention relates to a printed circuit board and a method of manufacturing the same, and more particularly, to a printed circuit board including a electromagnetic wave shielding structure and a method of manufacturing the same.

2. Description of the Related Art

A printed circuit board (PCB), which forms and prints line patterns on an electrical insulating board using a conductive material such as copper, indicates a board immediately before an electronic component is mounted thereon. That is, the PCB indicates a circuit board on which a mounted position of each electronic component is secured and a circuit wiring connecting electronic components to each other is printed on a flat plate surface and is fixed in order to densely mount many various kinds of electronic components on the flat plate.

Recently, in accordance with the development of an electronic industry, the use of a package in which memory chips are mounted on many electronic devices has rapidly increased. Therefore, in accordance with miniaturization, lightness, and multi-functionalization of an electronic product, thinness of an electronic product packaged has been required. As a result, the thinness or an increase in density of the printed circuit board which is one of important components has also been demanded.

Meanwhile, while a trend of slimness and lightness of a portable mobile and the electronic device for display has rapidly progressed, a transfer speed of signal between components in the device is speeded up, and the circuit board becomes a micro-circuit having high density, damage of electromagnetic interference (EMI) according to an electromagnetic wave noise occurring between circuits adjacent to each other has become increased.

In order to effectively shield the electromagnetic wave as described above, it is required to enclose the printed circuit board by a conductor film having excellent electrical conductivity to allow the electromagnetic wave occurring in the printed circuit board to be decreased through the conductor.

Therefore, the electromagnetic wave is shielded by attaching a metal thin film such aluminum foil or silver foil having excellent conductivity to the circuit board or uniformly applying a conductive paste which is manufactured by dispersing a conductive powder into a binder resin on the surface of the circuit board. Alternatively, a conductive adhesive sheet type product, or the like, in which the conductive paste is made in a sheet form and heated and attached may be applied.

In this connection, Korea Patent Laid-Open Publication No. 10-2001-0006198 suggests a board including a transmission line, a shield unit of shielding the transmission line which is arranged so as to enclose around the transmission line, and an insulating layer arranged between the transmission line and the shield unit.

However, the shield unit having the above-mentioned structure cannot but occupy one layer in an inner space of the board. Therefore, the number of layers of the board increases, such that the demand for the thinness of the board and the increase in density of the board is not met.

RELATED ART DOCUMENT

Patent Document (Patent Document 1) Patent Document: Korean Patent Laid-Open Publication No. 10-2001-0006198

SUMMARY OF THE INVENTION

An object of the present invention is to solve the problems as described above by suggesting a printed circuit board including a conductive core in an insulating layer and a core layer and a method of manufacturing the same.

According to an exemplary embodiment of the present invention, there is provided a printed circuit board, including: a core layer having a first circuit wiring layer formed on one surface or both surfaces thereof; an insulating layer laminated, as at least one layer, on one surface or both surfaces of the core layer; and a second circuit wiring layer formed on one surface of the insulating layer, wherein a conductive core for shielding an electromagnetic wave may be included in the insulating layer contacting the first circuit wiring layer or the second circuit wiring layer.

The conductive core for shielding the electromagnetic wave may be included in the core layer.

When the insulating layer or the core layer is divided into two areas of upper and lower areas having the same height, the conductive core may be included in an area close to the first or second circuit wiring layer requiring the electromagnetic wave shielding.

The conductive core may be a carbon fiber.

The printed circuit board may further include: a first via electrode penetrating through the core layer or the insulating layer; and an inner wall insulating layer included between the core layer or the insulating layer in which the first via electrode is formed and the first via electrode.

The printed circuit board may further include a second via electrode formed in the core layer or the insulating layer, wherein one end of the second via electrode may be connected to the conductive core in the core layer or the insulating layer in which the second via electrode is formed, and the other end thereof may be connected to the first or second circuit wiring layer on one surface of the core layer or the insulating layer in which the second via electrode is formed.

The first or second circuit wiring layer connected to the other end of the second via electrode may be a ground wiring or a power wiring.

According to another exemplary embodiment of the present invention, there is provided a method of manufacturing a printed circuit board, the method including: preparing a core layer including a conductive core therein; processing a primary via hole penetrating through the core layer; filling an inner portion of the primary via hole with an insulating resin and then processing a secondary via hole having a diameter smaller than that of the primary via hole at a position in which the primary via hole is formed; forming a first circuit wiring layer on one surface or both surfaces of the core layer including a first via electrode in the secondary via hole; and applying an insulating layer including the conductive core therein on one surface or both surfaces of the core layer.

When the insulating layer or the core layer is divided into two areas of upper and lower areas having the same height, the conductive core included in the core layer or the insulating layer may be included in an area close to the first circuit wiring layer requiring an electromagnetic wave shielding.

The method may further include: processing a via hole having a predetermined height at a predetermined position of the insulating layer so that the conducive core in the insulating layer is exposed to the outside; and forming a second circuit wiring layer on one surface of the insulating layer including a second via electrode formed in the via hole.

An insulating layer covering the second circuit lien layer may be additionally coated, a process in which the second circuit wiring layer is printed on the additionally coated insulating layer may be repeated as needed, and the insulating layer including the conductive core therein may be coated when the insulating layer disposed on upper and lower surfaces of the second circuit wiring layer requiring an electromagnetic wave shielding is coated.

DESCRIPTION OF THE PREFERRED EMBODIMENTS

Figure 1:
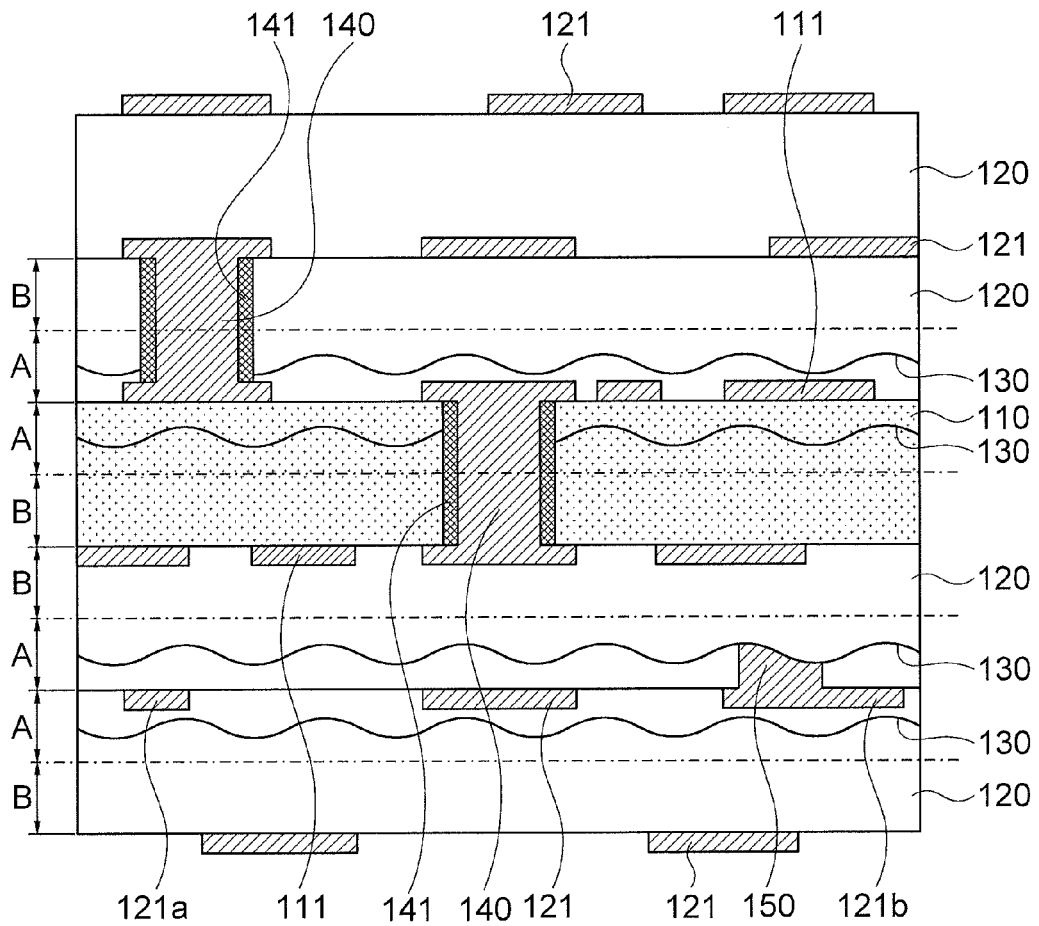
FIG. 1 is a cross-sectional view of a printed circuit board according to the exemplary embodiment of the present invention.

Various advantages and features of the present invention and methods accomplishing thereof will become apparent from the following description of embodiments with reference to the accompanying drawings. However, the present invention may be modified in many different forms and it should not be limited to the embodiments set forth herein. These embodiments may be provided so that this disclosure will be thorough and complete, and will fully convey the scope of the invention to those skilled in the art. Like reference numerals throughout the description denote like elements.

Terms used in the present specification are for explaining the embodiments rather than limiting the present invention. Unless explicitly described to the contrary, a singular form includes a plural form in the present specification. The word "comprise" and variations such as "comprises" or "comprising," will be understood to imply the inclusion of stated constituents, steps, operations and/or elements but not the exclusion of any other constituents, steps, operations and/or elements.

FIG. 1 is a cross-sectional view of a printed circuit board according to the exemplary embodiment of the present invention. Additionally, components shown in the accompanying drawings are not necessarily shown to scale. For example, sizes of some components shown in the accompanying drawings may be exaggerated as compared with other components in order to assist in the understanding of the exemplary embodiments of the present invention.

Referring to FIG. 1, the printed circuit board 100 according to the exemplary embodiment of the present invention may be configured of a core layer 110 having a first circuit wiring layer 111 formed on one surface or both surfaces thereof, a insulating layer 120 laminated on one surface or both surfaces of the core layer 110, and a second circuit wiring layer 121 formed on one surface of the insulating layer 120.

Here, the core layer 110 and the insulating layer 120 may be configured of a prepreg or an ajinomoto build up film (ABF) which is a general insulating material. Particularly, the core layer 110, which is a center layer of the board, may have a filler such as a paper, a glass fiber and a glass cloth added thereto in order to reinforce mechanical strength or may have thickness thicker than that of the insulating layer 120.

The core layer 110 may use a copper clad laminate (CCL) having a copper foil laminated on one surface or both surfaces thereof. In this case, the first circuit wiring layer 111 formed on one surface or both surfaces of the core layer 110 may be formed by selectively etching the copper foil. Similarly, the second circuit wiring layer 121 formed on one surface of the insulating layer 120 may also be formed by using a circuit molding method well known in the art to which the present invention pertains.

The above-mentioned first and second circuit layers (a second via electrode 150) may become a signal wiring in which a signal transmission with an external element such as a semiconductor chip is performed, or a part thereof may become a ground wiring or a power wiring. Therefore, in the case in which current flows in the first and second circuit wiring layers 111 and 121, the first and second layers 111 and 121 may radiate an unnecessary electromagnetic wave to another wiring layer or may be subjected to an electromagnetic interference (EMI) from another wiring layer or an external noise source.

Therefore, in the printed circuit board according to the exemplary embodiment of the present invention, a conductive core 130 may be included in the insulating layers 120 disposed on upper and lower portions of the circuit wiring layer requiring an electromagnetic wave shielding unit.

For example, as shown in FIG. 1, in the case in which electromagnetic shielding is required for a specific pattern 121a of the second circuit wiring layer 121, the conductive core 130 may be each included in the insulating layers 120 disposed on upper and lower portions of the specific pattern 121a. Similarly, in the case in which the electromagnetic shielding is required for a specific pattern of the first circuit wiring layer 111 formed on an upper surface of the core layer 110, the conductive core 130 may be each included in the core layer 110 and the insulating layer 120 laminated on the upper surface of the core layer 110.

A specific example of the above-mentioned conductive core 130 may include a carbon fiber made of non-graphitic carbon which is obtained by carbonizing a fiber which is radiated with an organic material such as an organic fiber, a resin and a pitch and then by thermally processing the carbonized fiber at 3000° C. or more. In the case of the carbon fiber, the carbon fiber includes at least 90% carbon, such that it is effective to decrease the electromagnetic wave. The conductive core 130 in the present invention may use the carbon fiber selected from the group in which the carbon fiber is classified into a typical carbon fiber of a pan series or a pitch series having an average diameter of a cross-section of 1 to 15 μm, and as a content ratio of the carbon contained in the carbon fiber increases, the electromagnetic wave decrease effect increases.

More specifically, the conductive core 130 may be included in an area close to the circuit wiring layer requiring the electromagnetic wave shielding, in the case in which the insulating layer 120 or the core layer 110 is divided into two areas of upper and lower areas having the same height. For example, as shown in FIG. 1, in the case in which the insulating layer 120 or the core layer 110 is divided into an A area and a B area having the same height according to a virtual cutting line, the conductive core 130 may be included in the A area adjacent to the circuit wiring layer requiring the electromagnetic wave shielding.

As described above, the printed circuit board 100 according to the exemplary embodiment of the present invention may implement the thinness of the board without designing the separate space for forming the electromagnetic wave shielding layer as in the case according to the related art, by adopting the insulating layer or the core layer including the conductive core therein as the electromagnetic wave shielding structure.

In addition, since the circuit wiring layer may be formed at the position in which the electromagnetic wave shielding layer according to the related art is formed, more circuit wiring layers may be designed even in the printed circuit board having the same number of layers, thereby making it possible to implement the increase in the density of the board.

Meanwhile, the printed circuit board 100 according to the exemplary embodiment of the present invention may include a first via electrode 140 penetrating through the core lay 110 or the insulating layer 120. The first via electrode 140 serves to electrically connect between the upper and lower circuit wiring layers, wherein an inner wall insulating layer 141 is interposed between the core layer 110 and the first via electrode 140 in order to secure an insulation property between the conductive core 130 included in the core layer 110 or the insulating layer 120 and the first via electrode 140.

In addition, the printed circuit board 100 according to the exemplary embodiment of the present invention may further include a second via electrode 150 for electrically connecting the second circuit wiring layer 121 to the conductive core 130. For example, as shown in FIG. 1, the specific pattern 121*b* and the conductive core 130 in the insulating layer 120 in which the specific pattern 121*b* is printed are electrically connected to each other through the second via electrode 150.

In this case, the specific pattern 121*b* may be the ground wiring or the power wiring. Therefore, the conductive core 130 which is connected to the specific pattern 121*b* through the second via electrode 150 may be used as the ground wiring or the power wiring, thereby making it possible to decrease the layer for forming the ground wiring or the power wiring.

Hereinafter, a method of manufacturing a printed circuit board according to an exemplary embodiment of the present invention will be described.

FIGS. 2 to 6 are flowcharts sequentially showing a method of manufacturing the printed circuit board according to the exemplary embodiment of the present invention. For reference, like reference numerals in FIG. 1 and FIGS. 2 to 6 represent like components and similar reference numerals may represent similar components, but not always.

Figure 2:
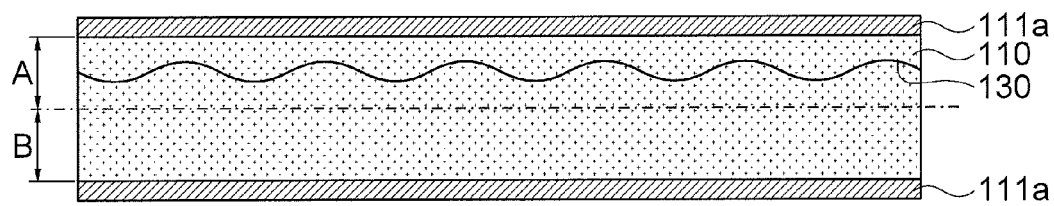
FIGS. 2 to 6 are flowcharts sequentially showing a method of manufacturing the printed circuit board according to the exemplary embodiment of the present invention.

The method of manufacturing the printed circuit board according to the exemplary embodiment of the present invention first prepares the core layer 110 in which the conductive core 130 is included, as shown in FIG. 2.

Here, the core layer 110 may have the copper foil 111*a* laminated on one surface or both surfaces thereof and the conductive core 130 in the core layer 110 may use the typical carbon fiber of the pan series or the pitch series.

In order to manufacture the core layer 110 as described above, two prepregs are first prepared and the conductive core 130 is interposed between the two prepregs. Next, the copper foils 111*a* are laminated on surfaces of the prepregs, respectively, and are then heated, pressed, and molded to thereby be integrated with each other. In this case, it is preferable to prepare the prepregs having different thicknesses so that a position of the conductive core 130 is close to the circuit wiring layer requiring the electromagnetic wave shielding. That is, when the conductive core 130 is interposed between the prepregs having different thicknesses and the circuit wiring layer requiring the electromagnetic wave shielding is formed using the copper foil 111*a* on one surface of the prepreg having a thin thickness, the conductive core 130 may be included in the core layer 110 so as to be closer to the circuit wiring layer requiring the electromagnetic wave shielding.

Figure 3:
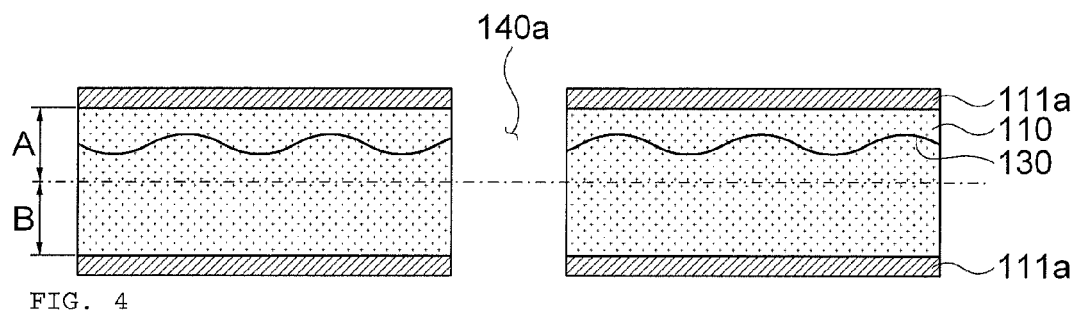
Figure 4:
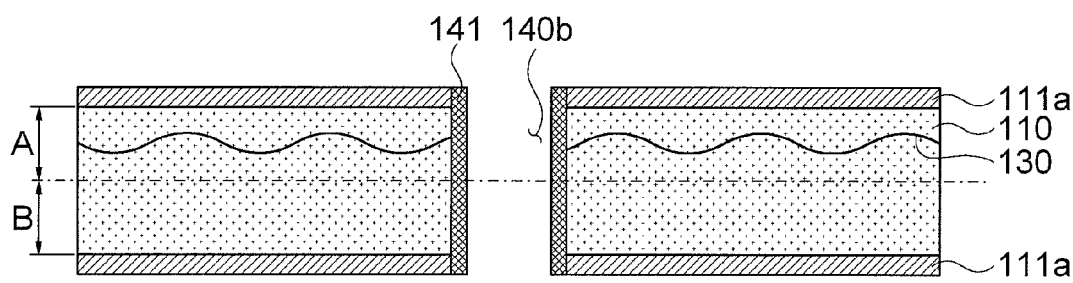

Next, as shown in FIG. 3, a primary via hole 140*a* penetrating through the core layer 110 is processed.

This is a process for forming the first via electrode 140 electrically connecting the first circuit wiring layers 111 on the upper and lower portions of the core layer 110 according to a subsequent process and may be processed at a predetermined position of the prepared core layer 110 using a drill or laser. After this process is completed, a desmear process of removing a smear of an inner wall of the primary via hole 140*a* may be conducted using an etching solution such as a potassium permanganate solution.

Next, an inner part of the primary via hole 140*a* is filled with an insulating resin and a secondary via hole 140*b* having a diameter smaller than that of the primary via hole 140*a* is then processed at the position in which the primary via hole 140*a* is formed. Through the processes as described above, as shown in FIG. 4, an inner wall insulating layer 141 insulating between the conductive core 130 in the core layer 110 and the first via electrode 140 formed according to the subsequent process is formed.

Figure 5:
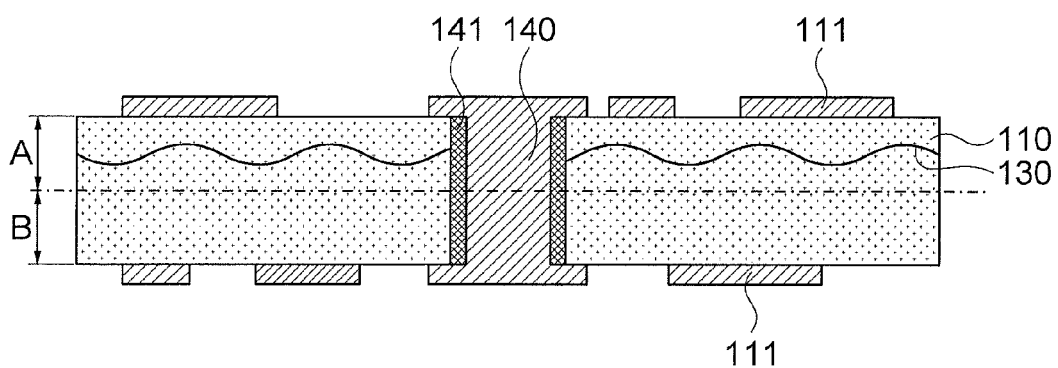

As described above, when the inner wall insulating layer 141 is formed in the core layer 110, as shown in FIG. 5, the first circuit wiring layer 111 is formed on one surface or both surfaces of the core layer 110 in which the first via electrode 140 is included in the secondary via hole 140*b*.

The first circuit wiring layer 111 may be formed according to circuit molding methods such as a generally known subtractive method, an additive method, a semi-additive method, or a modified semi-additive (MSAP) method using the copper foil 111*a* laminated on one surface or both surfaces of the core layer 110.

In addition, at the time of conducting the above-mentioned circuit molding method, a seed layer (not shown in figure) for electrolysis plating is formed on the surface of the copper surface 111*a* including the secondary via hole 140*b* and the electrolysis plating may be performed using the seed layer as a leadline, wherein in this process, the first via electrode 140 may be fill plated in the secondary via hole 140*b*.

Figure 6:
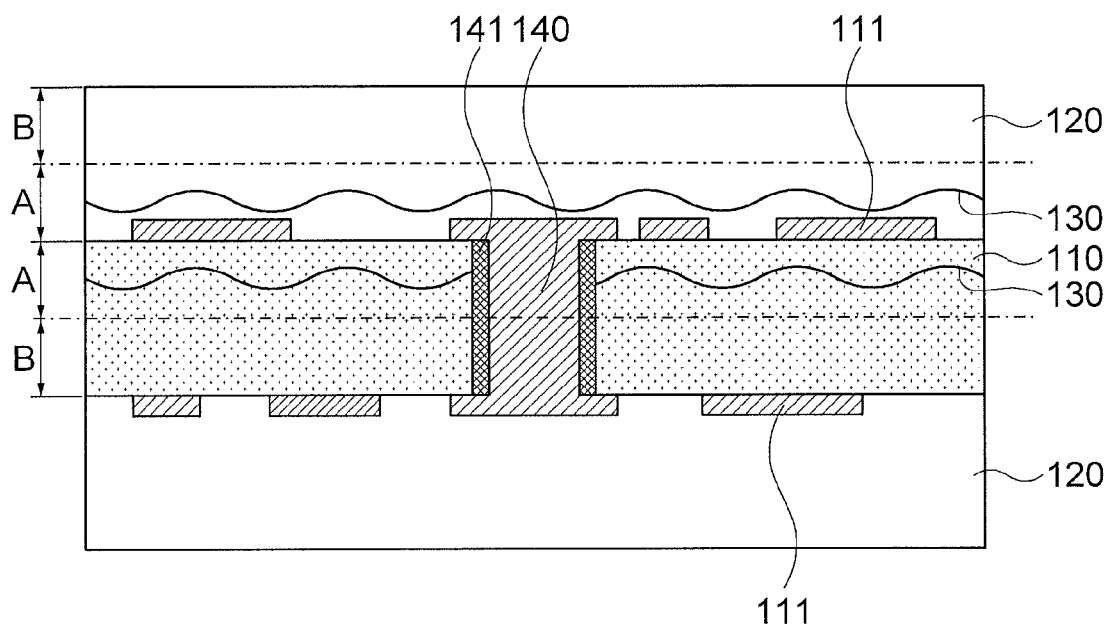

As described above, in the case in which the first via electrode 140 and the first circuit wiring layer 111 are formed, as shown in FIG. 6, a film-shaped insulating resin material having an epoxy resin as a main component is applied on one surface or both surfaces of the core layer 110 and then cured, thereby forming an insulating layer 120 covering the first circuit wiring layer 111.

Here, since the electromagnetic wave shielding is required for the first circuit wiring layer 111 formed on the upper surface of the core layer 110, the conductive core 130 is included in the insulating layer 120 laminated on the upper surface of the core layer 110, more specifically, in the A area close to the first circuit wiring layer 111, when the insulating layer 120 is divided into the A area and the B area having the same height according to the virtual cutting line. Therefore, the conductive core 130 is close to the first circuit wiring layer 111 requiring the electromagnetic wave shielding, thereby making it possible to efficiently decrease the electromagnetic wave.

Although FIGS. 2 to 6 show the printed circuit board in which the first circuit wiring layer 111 is formed on both surfaces of the core layer 110, the second circuit wiring layer 121 may be laminated as plural layers by a build-up process, as shown in FIG. 1. Here, in the case in which the electromagnetic wave shielding is required for the second circuit wiring layer 121, the conductive core 130 may be included in the insulating layer 120 on the upper and lower portions of the second circuit wiring layer 121. Of course, also in this case, when the insulating layer is divided into the A area and the B area having the same height according to the virtual cutting line, the conductive core may be included in the A area close to the second circuit wiring layer 121 requiring the electromagnetic wave shielding.

With the printed circuit board and the method of manufacturing the same according to the exemplary embodiment of the present invention, it is possible to implement the thinness of the board without designing the separate space for forming the electromagnetic wave shielding layer as in the case according to the related art, by adopting the insulating layer or the core layer including the conductive core therein as the electromagnetic wave shielding structure.

In addition, since the circuit wiring layer may be formed at the position in which the electromagnetic wave shielding layer according to the related art is formed, more circuit wiring layers may be designed even in the printed circuit board having the same number of layers, thereby making it possible to implement the increase in the density of the board.

In addition, the conductive core may be used as the ground wiring or the power wiring by electrically connecting the circuit wiring layer used as the ground wiring or the power wiring to the conductive core in the core layer or the insulating layer, thereby making it possible to decrease the layer for forming the ground wiring or the power wiring.

The above detailed description has illustrated the present invention. Although the exemplary embodiments of the present invention have been described, the present invention may be also used in various other combinations, modifications and environments. In other words, the present invention may be changed or modified within the range of concept of the invention disclosed in the specification, the range equivalent to the disclosure and/or the range of the technology or knowledge in the field to which the present invention pertains. The exemplary embodiments described above have been provided to explain the best state in carrying out the present invention. Therefore, they may be carried out in other states known to the field to which the present invention pertains in using other inventions such as the present invention and also be modified in various forms required in specific application fields and usages of the invention. Therefore, it is to be understood that the invention is not limited to the disclosed embodiments. It is to be understood that other embodiments are also included within the spirit and scope of the appended claims.

What is claimed is:

1. A printed circuit board, comprising:
   a core layer having a first circuit wiring layer formed on one surface or both surfaces thereof;
   an insulating layer laminated, as at least one layer, on one surface or both surfaces of the core layer, the insulating layer including
     a conductive core, being an electromagnetic wave shielding layer having a continuous form in the insulating layer;
   a second circuit wiring layer formed on one surface of the insulating layer; and
   a via penetrating through the insulating layer and through the conductive core, electrically connecting the first circuit wiring layer to the second circuit wiring layer, and electrically insulated from the conductive core,
   wherein the insulating layer is contacting the first circuit wiring layer or the second circuit wiring layer.

2. The printed circuit board according to claim 1, further comprising:
   a second conductive core to shield electromagnetic waves, included in the core layer.

3. The printed circuit board according to claim 1, wherein when the insulating layer or the core layer is divided into two areas of upper and lower areas having the same height, the conductive core is included in an area close to the first or second circuit wiring layer requiring the electromagnetic wave shielding.

4. The printed circuit board according to claim 1, wherein the conductive core is a carbon fiber.

5. The printed circuit board according to claim 1, further comprising:
   a first via electrode penetrating through the core layer; and
   an inner wall insulating layer included between the core layer in which the first via electrode is formed and the first via electrode.

6. The printed circuit board according to claim 1, further comprising a second via electrode formed in the core layer or the insulating layer,
   wherein one end of the second via electrode is connected to the conductive core, and the other end thereof is connected to the first or second circuit wiring layer on one surface of the core layer or the insulating layer in which the second via electrode is formed.

7. The printed circuit board according to claim 6, wherein the first or second circuit wiring layer connected to the other end of the second via electrode is a ground wiring or a power wiring.

8. The printed circuit board according to claim 2, wherein when the insulating layer or the core layer is divided into two areas of upper and lower areas having the same height, the second conductive core is included in an area close to the first or second circuit wiring layer requiring the electromagnetic wave shielding.

9. The printed circuit board according to claim 2, wherein the second conductive core is a carbon fiber.

10. The printed circuit board according to claim 2, further comprising:
    a first via electrode penetrating through the core layer or the insulating layer; and
    an inner wall insulating layer included between the core layer or the insulating layer in which the first via electrode is formed and the first via electrode.

11. The printed circuit board according to claim 2, further comprising a second via electrode formed in the core layer or the insulating layer,
    wherein one end of the second via electrode is connected to the second conductive core, and the other end thereof is connected to the first or second circuit wiring layer on one surface of the core layer or the insulating layer in which the second via electrode is formed.

12. The printed circuit board of claim 1, wherein the conductive core is at a certain depth within the insulating layer distanced from a central depth of the insulating layer, so as to be positioned closer to the first circuit wiring layer than to the second circuit wiring layer.

* * * * *